US011227908B2

(12) United States Patent
Jia

(10) Patent No.: US 11,227,908 B2
(45) Date of Patent: Jan. 18, 2022

(54) FLEXIBLE ORGANIC LIGHT-EMITTING DIODE SUBSTRATE AND MANUFACTURING METHOD THEREOF

(71) Applicant: Wuhan China Star Optoelectronics Semiconductor Display Technology Co., Ltd., Hubei (CN)

(72) Inventor: Yongzhen Jia, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 174 days.

(21) Appl. No.: 16/344,308

(22) PCT Filed: Jan. 9, 2019

(86) PCT No.: PCT/CN2019/070998
§ 371 (c)(1),
(2) Date: Apr. 23, 2019

(87) PCT Pub. No.: WO2020/113764
PCT Pub. Date: Jun. 11, 2020

(65) Prior Publication Data
US 2021/0005695 A1    Jan. 7, 2021

(30) Foreign Application Priority Data
Dec. 3, 2018 (CN) .......................... 201811465761.9

(51) Int. Cl.
*H01L 27/32* (2006.01)
*H01L 51/52* (2006.01)
(Continued)

(52) U.S. Cl.
CPC ...... *H01L 27/3276* (2013.01); *H01L 51/0097* (2013.01); *H01L 51/56* (2013.01); *H01L 2227/323* (2013.01); *H01L 2251/5338* (2013.01)

(58) Field of Classification Search
CPC . H01L 51/56; H01L 51/0097; H01L 27/3276; H01L 2226/323;
(Continued)

(56) References Cited

U.S. PATENT DOCUMENTS

2007/0264759 A1* 11/2007 Kamakura .......... H01L 27/1292
438/141
2011/0128237 A1*  6/2011 Kopf ...................... G06F 3/041
345/173
(Continued)

FOREIGN PATENT DOCUMENTS

CN        106783880 A    5/2017
CN        107660066 A    2/2018
(Continued)

*Primary Examiner* — Caridad Everhart
(74) *Attorney, Agent, or Firm* — Hamre, Schumann, Mueller & Larson, P.C.

(57) ABSTRACT

A flexible organic light-emitting diode (OLED) display substrate and manufacturing method using the same are provided. The flexible OLED display substrate includes a display region, a non-display region, and a bending region connected to the display region and the non-display region. The bending region is provided with multiple liquid conductive wires spaced from each other. Each liquid conductive wire includes a conductive flow channel disposed in the bending region and a pair of metal wire portions connected to two ends of the conductive flow channel. A packaging layer is arranged on each conductive flow channel to store a liquid conductive material. The liquid conductive material is sealed in each conductive flow channel. Therefore, the liquid conductive wires can greatly improve the production yield of the bending region, and overcome a problem that a conventional bending region is prone to break during a bending process.

9 Claims, 4 Drawing Sheets

(51) Int. Cl.
*G09F 9/30* (2006.01)
*H01L 51/00* (2006.01)
*H01L 51/56* (2006.01)

(58) Field of Classification Search
CPC ......... H01L 2251/5338; H01L 27/1244; H01L 2227/323; G09F 9/301
See application file for complete search history.

(56) References Cited

U.S. PATENT DOCUMENTS

| | | | |
|---|---|---|---|
| 2016/0056379 A1* | 2/2016 | Brug | H01L 27/3246 257/40 |
| 2016/0359133 A1* | 12/2016 | Wang | H01L 51/5203 |
| 2017/0060229 A1* | 3/2017 | Youngs | G06F 1/3296 |
| 2017/0060299 A1* | 3/2017 | Choi | H05K 1/0283 |
| 2017/0256599 A1* | 9/2017 | Kim | H01L 51/5203 |
| 2017/0367179 A1* | 12/2017 | Holbery | G06F 1/1613 |
| 2018/0182983 A1 | 6/2018 | Bae et al. | |
| 2019/0013379 A1* | 1/2019 | Kim | H01L 51/52 |
| 2019/0132946 A1* | 5/2019 | Yang | H05K 1/0272 |
| 2019/0157311 A1 | 5/2019 | Zhang | |

FOREIGN PATENT DOCUMENTS

| | | |
|---|---|---|
| CN | 107946317 A | 4/2018 |
| CN | 108598142 A | 9/2018 |
| KR | 20180073742 A | 7/2018 |

* cited by examiner

FLEXIBLE ORGANIC LIGHT-EMITTING DIODE SUBSTRATE AND MANUFACTURING METHOD THEREOF

FIELD OF DISCLOSURE

The present invention relates to a field of display devices and in particular, to a flexible organic light-emitting diode (OLED) substrate and a manufacturing method thereof.

DESCRIPTION OF RELATED ART

In today's era of full-screen display smartphones, major mobile phone manufacturers take high screen-ratio smartphones as a main selling point of their flagship mobile phones. For panel manufacturers, increasing the screen ratio requires that a non-display region (i.e., a pad bending region) be reversely bent to the back of the display region, so that the screen ratio can be maximized. Therefore, the full screen display manufacturers aim to improve the bending performance of the pad bending region.

A conventional bending structure usually adopts a metal wiring structure of titanium/aluminum/titanium (Ti/Al/Ti) or molybdenum/aluminum/molybdenum (Mo/Al/Mo), and metal wiring is deposited onto a surface of a base film layer by a plasma sputtering process and is solidified by rapidly cooling from a high temperature state to form a fragile amorphous structure. The process inevitably causes micro-cracks on a surface of the metal wiring, and these micro-cracks are enlarged/increased during a bending process of the pad bending structure, which eventually results in breakage of the metal wiring. The pad bending structure's bending and breaking are important problems in a manufacturing process of modular parts of an OLED full-screen display, which are also a main reason for the decrease in production yield of the pad bending structure. In addition, because the micro-cracks have narrow widths, it is difficult to detect them under an ordinary microscope, and products having broken wiring are also difficult to repair.

SUMMARY

A conventional bending structure usually adopts a metal wiring structure of titanium/aluminum/titanium (Ti/Al/Ti) or molybdenum/aluminum/molybdenum (Mo/Al/Mo), and metal wiring is deposited onto a surface of a base film layer by a plasma sputtering process and is solidified by rapidly cooling from a high temperature state to form a fragile amorphous structure. The process inevitably causes micro-cracks on a surface of the metal wiring, and these micro-cracks are enlarged/increased during a bending process of the pad bending structure, which eventually results in breakage of the metal wiring. The pad Bending structure's bending and breaking is an important problem in a manufacturing process of modular parts of an OLED full-screen display, which is also a main reason for the decrease in production yield of the pad bending structure. In addition, since the micro-cracks have narrow widths, it is difficult to detect them under a microscope, and products having broken wiring are also difficult to repair.

Accordingly, the present invention provides a flexible organic light-emitting diode (OLED) display substrate and a manufacturing method thereof to solve the problem that metal wires of a conventional OLED display panel is prone to breakage during a bending process.

It is an objective of the present invention to provide a flexible OLED display substrate and a manufacturing method thereof. A liquid conductive material with high electrical conductivity and high bending strength constitutes a liquid conductive wire, the liquid conductive material is sealed by using an organic polymer material, and a transition design is applied between a metal wire portion and the liquid conductive material at two ends of a pad bending region, so that a contact area with the liquid conductive material is enlarged, and good electrical conductivity and functionality can be ensured.

Accordingly, a flexible organic light-emitting diode (OLED) display substrate is provided according to one embodiment of the present invention. The flexible OLED display substrate comprises a display region, a non-display region, and a bending region connected to the display region and the non-display region. The bending region is provided with a plurality of liquid conductive wires spaced apart from each other, each of the liquid conductive wires comprises a conductive flow channel disposed in the bending region and a pair of metal wire portions connected to two ends of the conductive flow channel, and a packaging layer is disposed on each conductive flow channel to store a liquid conductive material, wherein the liquid conductive material is sealed in each conductive flow channel, one end of each pair of metal wire portions is extended into each conductive flow channel and in contact with the liquid conductive material to be electrically connected thereto, and the other end of each pair of metal wire portions is electrically connected to the display region and the non-display region, respectively.

According to one embodiment of the present invention, each conductive flow channel is of a linear structure, a double-chain structure, an interlaced triple-chain structure, or an interlaced four-chain structure.

According to one embodiment of the present invention, a cross-section of each conductive flow channel is of a round shape, an oval shape, or a rectangular shape.

According to one embodiment of the present invention, the liquid conductive material consists of mercury or a saturated strong-electrolyte solution.

According to one embodiment of the present invention, the packaging layer is made of an organic polymer material.

According to another broad embodiment of the present invention, a flexible OLED display substrate is provided. The flexible OLED display substrate comprises a display region, a non-display region, and a bending region connected to the display region and the non-display region. The bending region is provided with a plurality of liquid conductive wires spaced apart from each other, each of the liquid conductive wires comprises a conductive flow channel disposed in the bending region and a pair of metal wire portions connected to two ends of the conductive flow channel, and a packaging layer is disposed on each conductive flow channel to store a liquid conductive material, wherein the liquid conductive material is sealed in each conductive flow channel.

According to one embodiment of the present invention, one end of each pair of metal wire portions is extended into each conductive flow channel and in contact with the liquid conductive material to be electrically connected thereto, and the other end of each pair of metal wire portions is electrically connected to the display region and the non-display region, respectively.

According to one embodiment of the present invention, each conductive flow channel is of a linear structure, a double-chain structure, an interlaced triple-chain structure, or an interlaced four-chain structure.

According to one embodiment of the present invention, a cross-section of each conductive flow channel is of a round shape, an oval shape, or a rectangular shape.

According to one embodiment of the present invention, the liquid conductive material consists of mercury or a saturated strong-electrolyte solution.

According to one embodiment of the present invention, the packaging layer is made of an organic polymer material.

The present invention further provides a manufacturing method of a flexible OLED display substrate, the flexible OLED display substrate comprising a display region, a non-display region, and a bending region connected to the display region and the non-display region, the manufacturing method comprising steps as follows:

S10: forming a plurality of liquid conductive wires spaced apart from each other on the bending region, each of the liquid conductive wires comprising a conductive flow channel disposed in the bending region and a pair of metal wire portions connected to two ends of the conductive flow channel;

S20: coating a packaging layer in each conductive flow channel;

S30: injecting a liquid conductive material into each conductive flow channel; and S40: performing a packaging process on each conductive flow channel to seal the liquid conductive material.

According to one embodiment of the present invention, in step 10, each conductive flow channel is formed by laser etching.

According to one embodiment of the present invention, in step S30, the liquid conductive material is disposed into the conductive flow channel by inkjet printing or an evaporation technology.

According to one embodiment of the present invention, after step S40, the manufacturing method further comprises a surface leveling process, a process of coating ultraviolet (UV)-curing adhesive, and a bending process.

Compared to conventional techniques, the invention can greatly improve production yield of the bending region, reduce production costs of an OLED full-screen display's modular parts, and further improve a profit margin of an OLED full-screen display's manufacturer. Furthermore, due to the fluidity of the liquid conductive material of the present invention, the bending region does not give stress to the liquid conductive material even after bending, and the packaging layer prevents leakage of the liquid conductive material. Each conductive flow channel with a structure having spaced-apart multiple chains eliminates the risk of channel clogging which may occur in the linear (a single-line form) conductive flow channel, thus ensuring that electrical signals of the bending region can be smoothly transmitted to the display region and the non-display region.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

The word "embodiment" mentioned in the detailed description means that a particular feature, structure, or characteristic described in connection with the embodiment may be included in at least one embodiment of the invention. The same terms appearing in different places in the specification are not necessarily limited to the same embodiment, but can belong to independent or alternative embodiments. In view of the technical solutions disclosed in the embodiments of the present invention, those skilled in the art should understand that the embodiments described herein may have other combinations or variations based on inventive concepts of the technical solutions.

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

Figure 1:
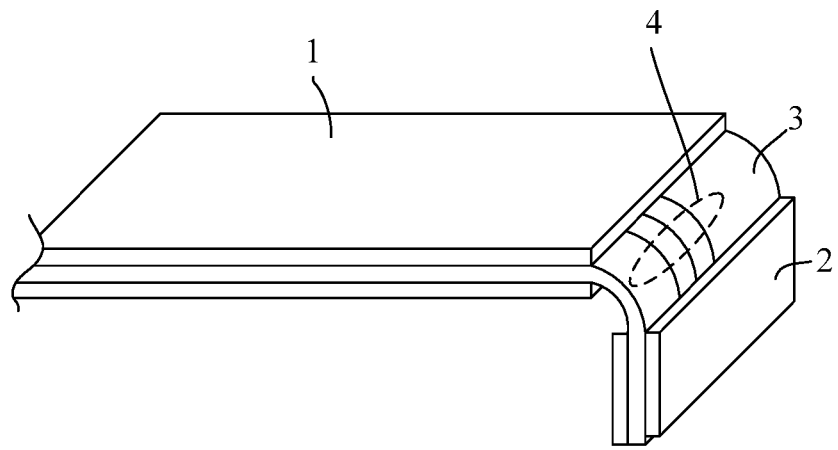
FIG. 1 is a schematic view illustrating a flexible organic light-emitting diode (OLED) substrate according to the present invention.
Figure 2:
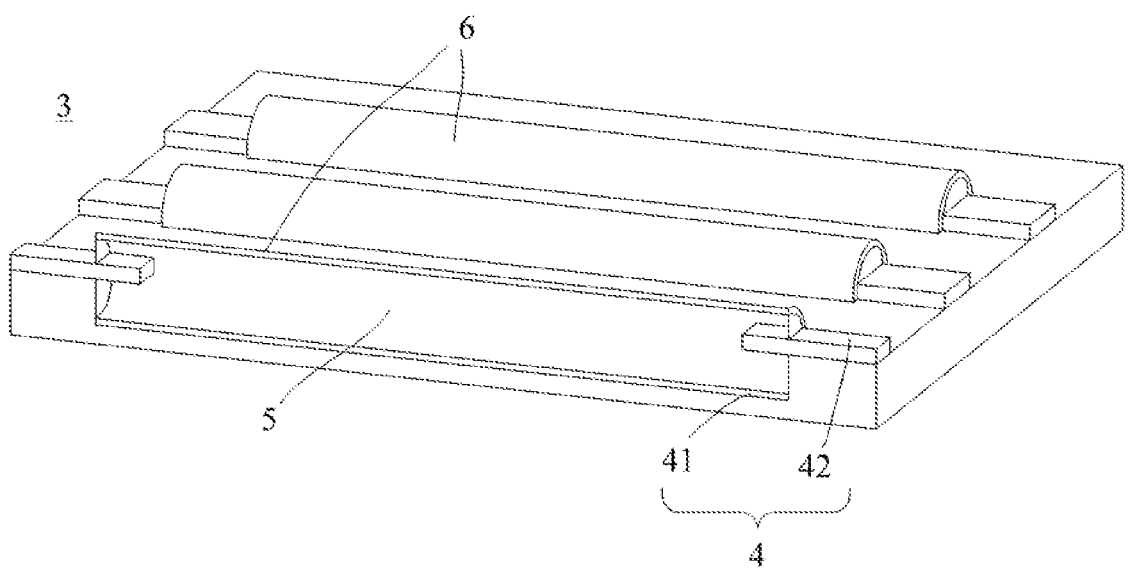
FIG. 2 is a schematic view illustrating a bending region according to the present invention.

Referring to FIGS. 1 and 2, the present invention provides a flexible organic light-emitting diode (OLED) display substrate. The flexible OLED display substrate comprises a display region 1, a non-display region 2, and a bending region 3 connected to the display region 1 and the non-display region 2. The bending region 3 is provided with a plurality of liquid conductive wires 4 spaced apart from each other. Each of the liquid conductive wires 4 comprises a conductive flow channel 41 disposed in the bending region 3 and a pair of metal wire portions 42 connected to two ends of the conductive flow channel 41. A packaging layer 6 is disposed on each conductive flow channel 41 to store a liquid conductive material 5. The liquid conductive material 5 is sealed in the conductive flow channel 41.

In the embodiment shown in FIGS. 1 and 2, the liquid conductive material 5 consists of, for example, mercury, a saturated strong-electrolyte solution or other suitable fluid. The metal wire portions 42 do not have a limited shape, but are basically required to be covered by or immersed in the liquid conductive material 5, so as to ensure good electrical conductivity. In alternative embodiments, each metal wire portion 42 is constituted by two or more layers made of a material selected from aluminum (Al), titanium (Ti), molybdenum (Mo), and copper (Cu). For example, the metal wire portion is titanium/aluminum/titanium (Ti/Al/Ti) or molybdenum/aluminum/molybdenum (Mo/Al/Mo).

The packaging layer 6 is made of an organic polymer material and is applied to an inner surface and a vertical surface of the entire conductive flow channel 41. The organic polymer material is, for example, polyimide (PI), polyethylene terephthalate (PET), or other organic polymer materials having high water-proof properties and low liquid permeability, thus ensuring that the liquid conductive material 5 does not leak from the conductive flow channel 41.

Figure 3:
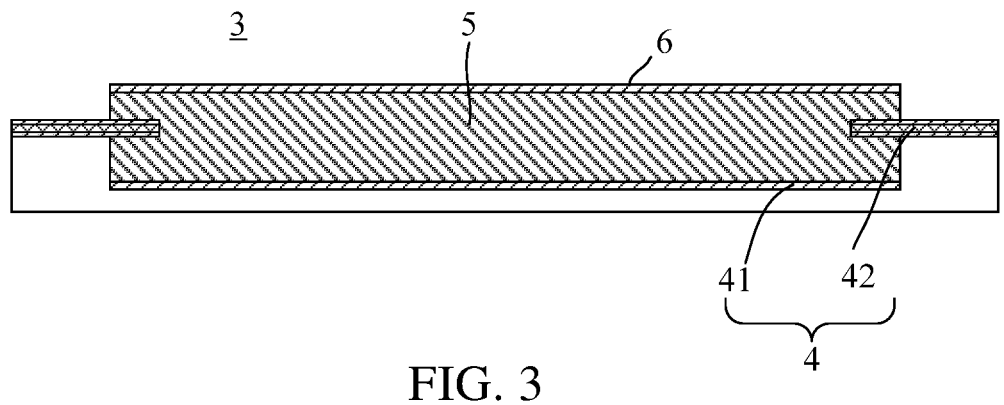
FIG. 3 is a cross-sectional view of FIG. 2.
Figure 4:
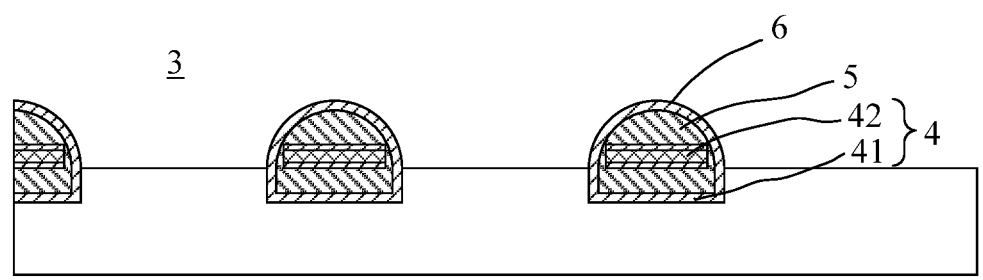
FIG. 4 is another cross-sectional view of FIG. 2.

Referring to FIGS. 2 to 4, one end of each pair of metal wire portions 42 is extended into each conductive flow channel 41 and in contact with the liquid conductive material 5 to be electrically connected thereto, thus enlarging a contact surface with the liquid conductive material 5. The other end of each pair of metal wire portions 42 is electrically connected to the display region 1 and the non-display region 2, respectively, thereby ensuring good electrical conductivity and functionality. A cross-section of each conductive flow channel 41 of the liquid conductive wire 4 is of a round shape, an oval shape, or a rectangular shape; however, the present invention is not limited in this regard.

Figure 6A:
FIGS. 6A to 6D are schematic views illustrating various structures of a conductive flow channel of the present invention.
Figure 6B:
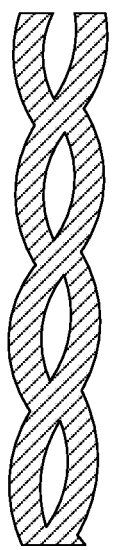
Figure 6C:
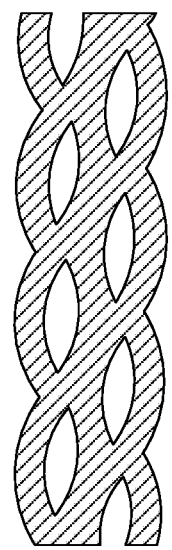
Figure 6D:
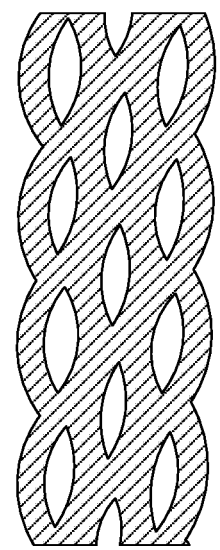

Referring to FIGS. 6A to 6D, each conductive flow channel 41 is of a linear structure, a double-chain structure, an interlaced triple-chain structure, or an interlaced four-chain structure. In detail, the conductive flow channel 41 in FIG. 2, FIG. 3, FIG. 4, and FIG. 6A is of a linear structure, the conductive flow channel 41 in FIGS. 6B, 6C and 6D is of a double-chain structure, an interlaced triple-chain structure, or an interlaced four-chain structure. The conductive flow channels 41 having a multiple-chain structure can eliminate risks of channel clogging which occurs in a linear (a single-line form) channel, thus ensuring that electrical signals of the bending region 3 can be smoothly transmitted to the display region 1 and the non-display region 2. In practice, a suitable structure can be chosen to be used in the conductive flow channels 41 of the liquid conductive wires 4 according to of requirements in the width of the liquid conductive wires 4.

Figure 5:
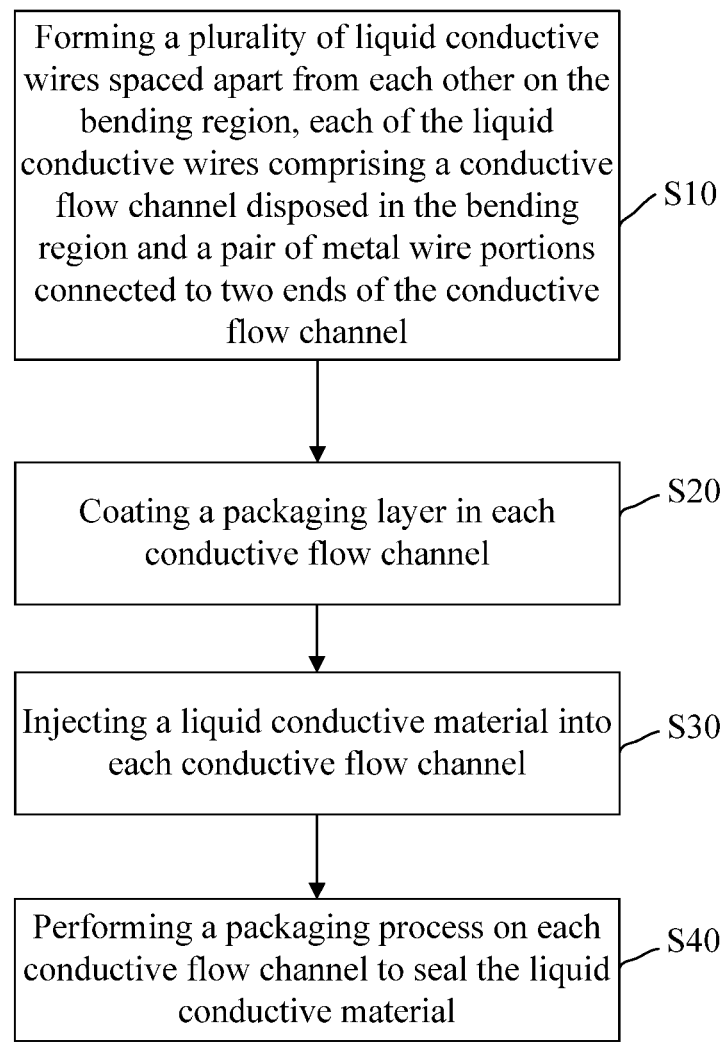
FIG. 5 is a process flow diagram illustrating a manufacturing method of the flexible OLED substrate.

Referring to FIG. 5, the present invention provides a manufacturing method of a flexible OLED display substrate. The flexible OLED display substrate comprises a display region, a non-display region, and a bending region connected to the display region and the non-display region. The manufacturing method comprises steps as follows:

S10: forming a plurality of liquid conductive wires spaced apart from each other on the bending region, each of the liquid conductive wires comprising a conductive flow channel disposed in the bending region and a pair of metal wire portions connected to two ends of the conductive flow channel;

S20: coating a packaging layer in each conductive flow channel;

S30: injecting a liquid conductive material into each conductive flow channel; and S40: performing a packaging process on each conductive flow channel to seal the liquid conductive material.

In step S10, each conductive flow channel is formed by laser etching. To be specific, a bottom layer of the flexible OLED display panel is laser etched to form the plurality of conductive flow channels. In step S20, each conductive flow channel which is formed by laser etching is coated a polymer packaging material, such as PI or PET.

In step S30, the liquid conductive material is disposed into the conductive flow channel by inkjet printing or an evaporation technology. Then, the packaging process is performed on each conductive flow channel to seal the liquid conductive material. The two metal wire portions at two ends of each conductive flow channel can be formed by inkjet printing, the evaporation technology or other suitable processes. After step S40, a back-end process for forming the bending region comprises a surface leveling process, a process of coating ultraviolet(UV)-curing adhesive, and a bending process. Accordingly, the flexible OLED display substrate is produced.

Therefore, the invention can greatly improve the production yield of the bending region, reduce production costs of an OLED full screen's modular parts, and further improve a profit margin of an OLED full screen manufacturer. Furthermore, due to the fluidity of the liquid conductive material of the present invention, the bending region does not give stress to the liquid conductive material even after bending, and the packaging layer prevents leakage of the liquid conductive material. The conductive flow channels with a spaced-apart multiple-chain structure eliminates the risk of channel clogging which may occur in the linear (a single-line form) conductive flow channel, thus ensuring that electrical signals of the bending region can be smoothly transmitted to the display region and the non-display region.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A flexible organic light-emitting diode (OLED) display substrate, the flexible OLED display substrate comprising a display region, a non-display region, and a bending region connected to the display region and the non-display region, wherein the bending region is provided with a plurality of liquid conductive wires spaced apart from each other, each of the liquid conductive wires comprises a conductive flow channel disposed in the bending region and a pair of metal wire portions connected to two ends of the conductive flow channel, and a packaging layer is disposed on each of the conductive flow channels to store and seal a liquid conductive material, wherein the liquid conductive material is sealed in each of the conductive flow channels, one end of each metal wire portion of each pair of metal wire portions extends into each of the conductive flow channels and comprises two opposite surfaces, the two opposite surfaces are in contact with and are electrically connected to the liquid conductive material, and the other end of each metal wire portion of each pair of metal wire portions is electrically connected to the display region or the non-display region, wherein the packaging layer is disposed on an inner surface and a vertical surface of an entire length of the conductive flow channel.

2. The flexible OLED display substrate according to claim 1, wherein the conductive flow channels are of a linear structure, a double-chain structure, an interlaced triple-chain structure, or an interlaced four-chain structure.

3. The flexible OLED display substrate according to claim 1, wherein a cross-section of the conductive flow channels is of a round shape, an oval shape, or a rectangular shape.

4. The flexible OLED display substrate according to claim 1, wherein the liquid conductive material consists of mercury or a saturated strong-electrolyte solution.

5. The flexible OLED display substrate according to claim 1, wherein the packaging layer is made of an organic polymer material.

6. A manufacturing method of a flexible OLED display substrate, the flexible OLED display substrate comprising a display region, a non-display region, and a bending region connected to the display region and the non-display region, the manufacturing method comprising steps as follows:

S10: forming a plurality of liquid conductive wires spaced apart from each other on the bending region, each of the liquid conductive wires comprising a conductive flow channel disposed in the bending region and a pair of metal wire portions connected to two ends of the conductive flow channel, wherein one end of each metal wire portion of each pair of metal wire portions extends into each of the conductive flow channels and comprises two opposite surfaces, and the other end of each metal wire portion of each pair of metal wire portions is electrically connected to the display region or the non-display region;

S20: coating a packaging layer in each of the conductive flow channels to store and seal a liquid conductive material, wherein the two opposite surfaces are in contact with and are electrically connected to the liquid conductive material, and the packaging layer is coated on an inner surface and a vertical surface of an entire length of the conductive flow channel;

S30: disposing a liquid conductive material into each of the conductive flow channels; and S40: performing a packaging process on each of the conductive flow channels to seal the liquid conductive material.

7. The manufacturing method of the flexible OLED display substrate according to claim 6, wherein in step S10, each of the conductive flow channels is formed by laser etching.

8. The manufacturing method of the flexible OLED display substrate according to claim 6, wherein in step S30, the liquid conductive material is disposed into each of the conductive flow channels by inkjet printing or an evaporation technology.

9. The manufacturing method of the flexible OLED display substrate according to claim 6, wherein after step S40, the manufacturing method of the flexible OLED display substrate further comprises a surface leveling process, a process of coating ultraviolet(UV)-curing adhesive, and a bending process.

\* \* \* \* \*